July 16, 1957 D. W. POWELL 2,799,837

CONNECTOR STRIP AND CHASSIS FOR INTERCONNECTING ELECTRONIC COMPONENTS

Filed July 22, 1955 4 Sheets-Sheet 1

DONALD W. POWELL
INVENTOR.

BY Henry Heyman

ATTORNEY

July 16, 1957 D. W. POWELL 2,799,837

CONNECTOR STRIP AND CHASSIS FOR INTERCONNECTING ELECTRONIC COMPONENTS

Filed July 22, 1955 4 Sheets-Sheet 2

Donald W. Powell,
*INVENTOR.*
*BY.*

[signature]

*ATTORNEY.*

July 16, 1957 D. W. POWELL 2,799,837

CONNECTOR STRIP AND CHASSIS FOR INTERCONNECTING ELECTRONIC COMPONENTS

Filed July 22, 1955 4 Sheets-Sheet 3

DONALD W. POWELL
INVENTOR.

BY Henry Heyman
ATTORNEY

July 16, 1957 D. W. POWELL 2,799,837

CONNECTOR STRIP AND CHASSIS FOR INTERCONNECTING ELECTRONIC COMPONENTS

Filed July 22, 1955 4 Sheets-Sheet 4

DONALD W. POWELL
INVENTOR.

BY Henry Heyman

ATTORNEY

United States Patent Office 2,799,837
Patented July 16, 1957

2,799,837

CONNECTOR STRIP AND CHASSIS FOR INTERCONNECTING ELECTRONIC COMPONENTS

Donald Warren Powell, Coldwater, Mich., assignor to Hughes Aircraft Company, Culver City, Calif., a corporation of Delaware Application July 22, 1955, Serial No. 523,855

2 Claims. (Cl. 339—17)

The present invention relates to connectors for electrical circuits and more particularly to connector strips that facilitate the interconnection of electronic components mounted on etched circuit boards and suitable for connecting the components to external electronic circuits.

Etched circuit boards having electronic components mounted thereon are relatively small dimensioned and are, therefore, very extensively used for miniaturized electronic equipment. In a complex electronic circuit, for example, it is customary to mount a number of such boards in a compact group and in such a manner that each board forms a separable unit or element of the more complex circuit. However, because of the compactness of the group of boards, connections between the components mounted on one board and those mounted on other boards or to external circuits have been difficult to provide while at the same time retaining the important feature of removability of each board.

Accordingly, it is an object of the present invention to provide connector strips for interconnecting electronic components on etched circuit boards arranged in a closely packed group without destroying the removability of the boards.

It is another object of the present invention to provide connector strips for connecting the electronic components on one etched circuit board to those on other etched circuit boards or to external circuits without the use of soldered joints or terminal screws.

The present invention overcomes the above and other difficulties encountered in the prior art by providing connector strips that facilitate the various connections of electronic components mounted on closely packed etched circuit boards and, at the same time, retain for each board the feature of removability. More particularly, according to an embodiment of the present invention, each connector strip comprises a strip of dielectric material having a first set of electrical conductors mounted, etched or printed on one side and a second set of conductors, intersecting the first set of conductors, similarly mounted, etched or printed on the reverse side. A plurality of connector pins are electrically connected to the first set of conductors and are adapted to connect with external electronic circuits while a plurality of spring contacts are electrically connected to the second set of conductors and adapted to conductively engage terminal tabs which are arranged along an edge of the etched circuit boards and electrically connected to the electronic components thereon. Thus, by electrically connecting the first set of conductors to the second set of conductors through the dielectric material at selected points of intersection, the electronic components may be connected in any desired manner.

Conductive engagements between the spring contacts and the terminal tabs may be easily achieved by manually pushing the etched circuit boards between the walls of the contacts to cause the spring elements of the contacts to frictionally grip the boards and, therefore, the proper terminal tabs. Such an arrangement eliminates the soldering of interconnecting leads between the electronic components on the boards or the use of binding screws for fastening such leads. Furthermore, it makes it possible to quickly and easily remove the boards whenever necessary as, for example, to replace faulty components.

The novel features which are believed to be characteristic of the invention, both as to its organization and method of operation, together with further objects and advantages thereof, will be better understood from the following description considered in connection with the accompanying drawings in which an embodiment of the invention is illustrated by way of example. It is to be expressly understood, however, that the drawings are for the purpose of illustration and description only, and are not intended as a definition of the limits of the invention.

Figures 1, 2:
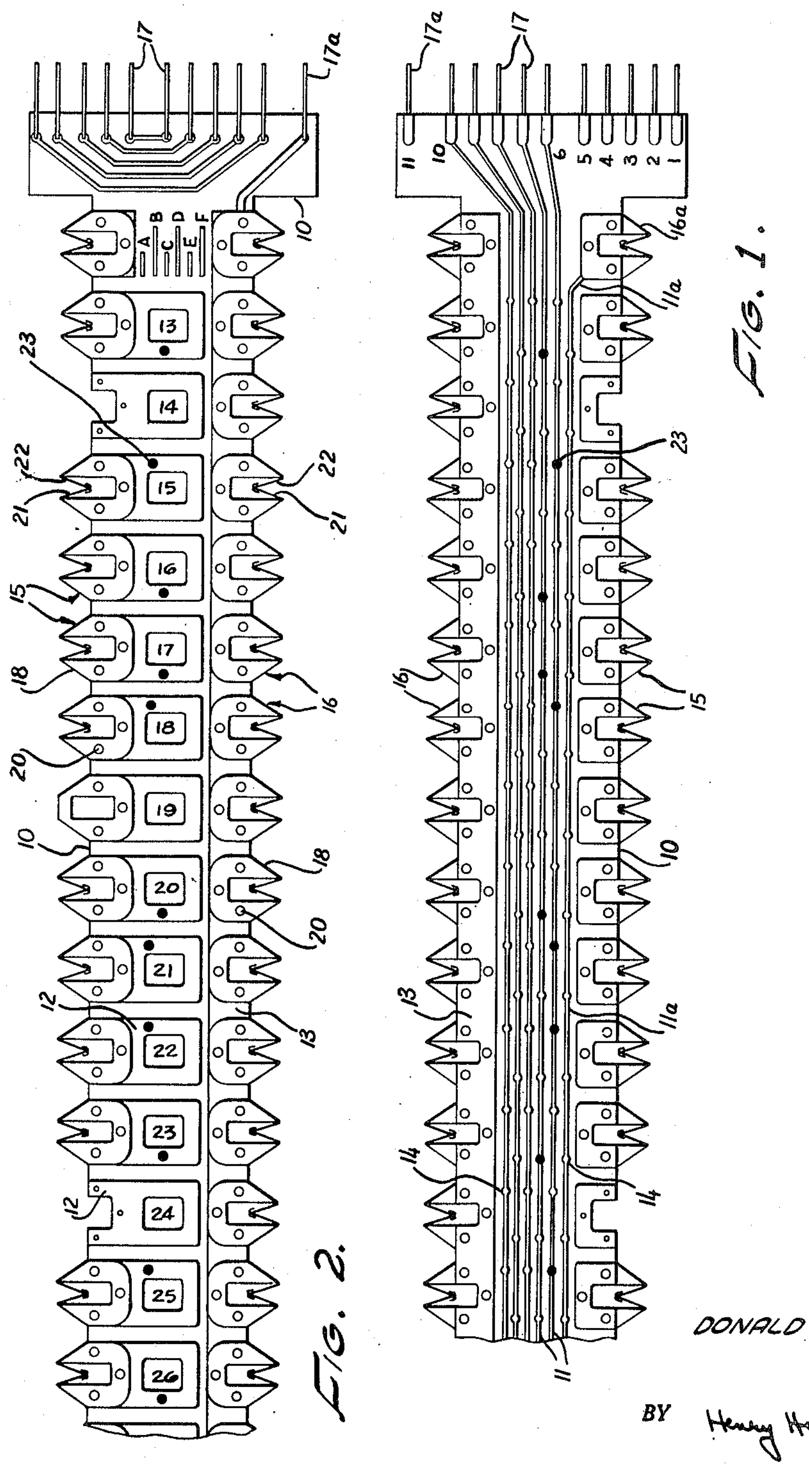
Fig. 1 is a top view of an embodiment of a connector strip according to the present invention.
Fig. 2 is a bottom view of the connector strip of Fig. 1.
Figure 3:
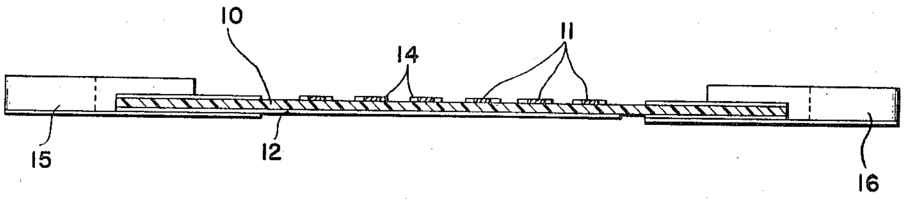
Fig. 3 is a cross-sectional view of the connector strip of Figs. 1 and 2 taken along the lines 3—3 in Fig. 1.

Referring now to the drawings, there is shown in Figs. 1, 2 and 3 a connector strip, in accordance with the present invention, that is utilized for interconnecting electronic components on etched circuit boards and for connecting the components to external electrical circuits. As shown in the figures, the connector strip comprises a base which is preferably a board 10 of dielectric material of generally rectangular shape having a wider rectangular end piece to form a T-shaped base. One face of board 10 has etched thereon a first set of conductors, such as conductors 11 in Fig. 1, and the opposite face of the board has etched thereon a second set of conductors, such as conductors 12 in Fig. 2. In addition, each face of the board has etched thereon a shorting bus bar 13.

Conductors 11 are linear and preferably etched parallel to the long edges of the connector strip and equally spaced from each other. Conductors 12, on the other hand, are preferably U-shaped and although also equally spaced from each other, are etched so that the portions of the conductors forming the legs of the U are substantially perpendicular to the long edges of the strip. Accordingly, the legs of each one of conductors 12 intersect all of conductors 11 at substantially right angles, the points of intersection being indicated by enlarged circular portions of conductors 11, as shown by circles 14 in Fig. 1. Bus bars 13 are etched along the same long edge of board 10 and are, therefore, superimposed.

Figure 4:
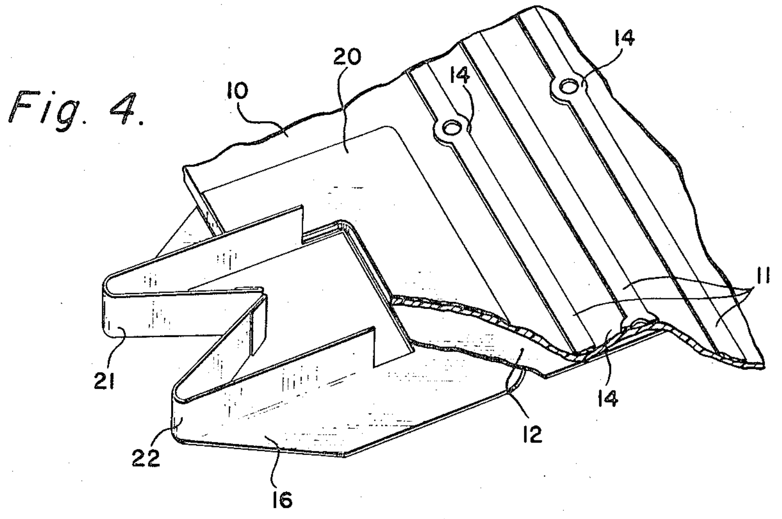
Fig. 4 is a perspective view, partly in cross-section, of a spring contact mounted on the connector strip of Figs. 1 and 2.

The connector strip of the present invention further comprises first and second pluralities of spaced spring contacts 15 and 16, respectively, and a plurality of spaced connector pins 17, contacts 15 being mounted along one long edge of board 10, contacts 16 being mounted along the other long edge of board 10, and connector pins 17 being mounted along an edge of the rectangular end piece of board 10 and extending from the edge preferably in the plane of the board. Each one of contacts 15 and 16 basically includes a U-shaped base 18 rigidly fixed to board 10 by means of rivets 20 and a pair of spring elements 21 and 22 extending from the tips of the U-shaped base, the spring elements being bent at an angle so as to point toward the trough of the U. The construction, configuration and particular manner in which the contacts are mounted on board 10 are shown in Fig. 4. Contacts 15 are electrically insulated from each other by board 10 while contacts 16 are electrically shorted to each other by bus bars 13, the bus bars, in turn, being electrically connected to each other by rivets 20.

One of the conductors 11, designated 11*a*, is electrically connected to one of the contacts 15, designated 15*a*, as shown in Fig. 1, and one of the connecting pins 17, designated 17*a*, is electrically connected to one of the bus bars 13, as shown in Fig. 2. Since bus bars 13 electrically interconnect contacts 16, as previously mentioned, pin 17*a* is electrically connected to all contacts 16. The other pins 17 are electrically and individually connected in pairs to the other conductors 11, as shown in Figs. 1 and 2, and the other contacts 15 are electrically and individually connected to conductors 12, as shown in Fig. 2, the electrical connections between conductors 12 and contacts 15 being made by mounting the contacts on board 10 in such a manner that the legs of each U-shaped base 18 of a contact are superimposed upon the legs of an associated U-shaped conductor 12.

Connector pins 17 are utilized to electrically connect conductors 11 to external circuits and contacts 15 are utilized to electrically connect conductors 12 to electronic components mounted on etched circuit boards. More specifically, the purpose of contacts 15 is to form the conducting link between conductors 12 and conductors etched on the etched circuit boards, as will be made clearer below from the description and the drawings. Thus, by electrically interconnecting desired ones of conductors 11 and conductors 12 at selected points of intersection 14, as shown by inked-in circles 23 in Figs. 1 and 2, the electronic components may be either electrically interconnected or connected to the external circuits, as previously mentioned.

Figure 5:
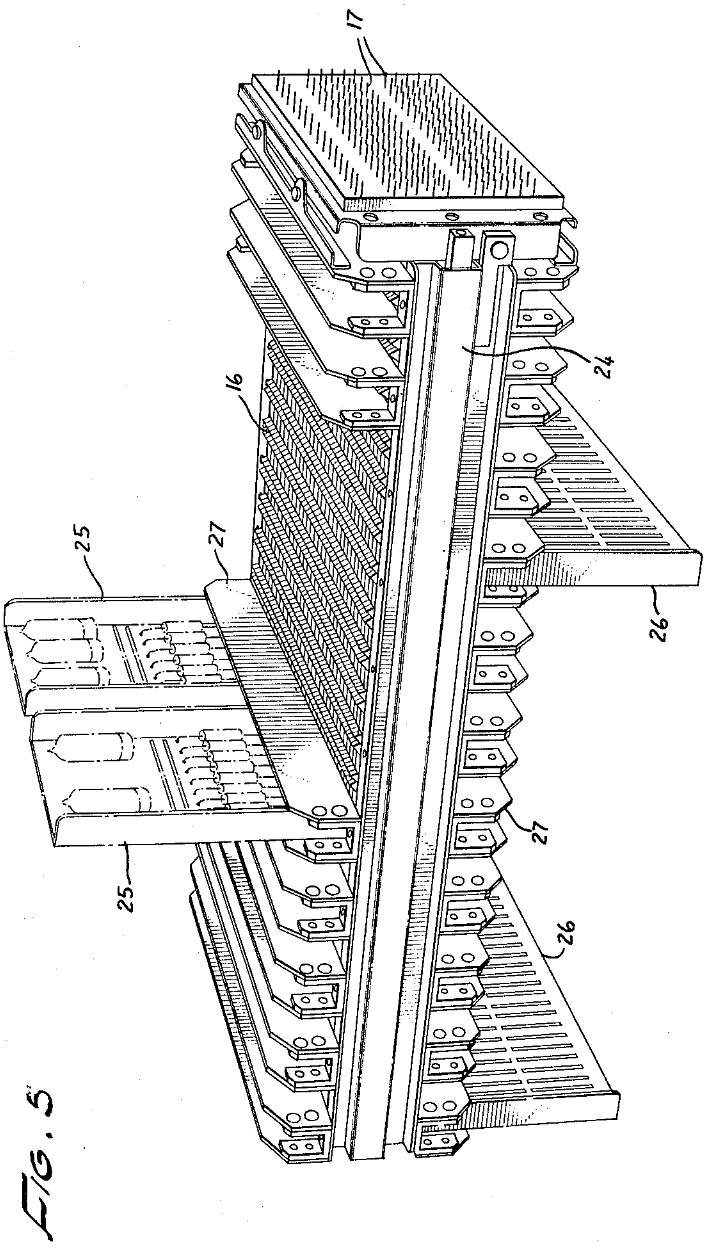
Fig. 5 is a perspective view of an assembly of connector strips of the type shown in Figs. 1 and 2 having etched circuit boards connected thereto.

In order to accommodate the various electrical connections of relatively large numbers of electronic components, a plurality of connector strips of the type shown in Figs. 1 and 2 may be mounted to form an array or assembly of connector strips. Thus, as shown in Fig. 5, a plurality of identical connector strips are mounted in parallel on a chassis 24, only connector pins 17 and contacts 16 being visible, conductors 11 and contacts 15 being shielded from view by portions of the chassis. The connector strips are spaced from each other and aligned in such a manner that connector pins 17 and contacts 16 form arrays of pins and contacts arranged in rows and columns, one vertical column of pins and contacts for each strip, each column of pins and contacts mounted along the appropriate edges of the associated strip, as previously mentioned.

Figure 6:
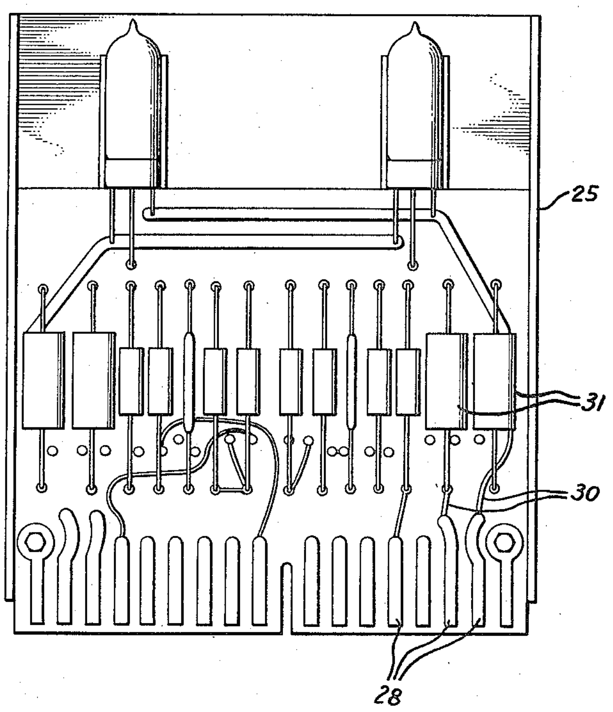
Fig. 6 is a top view of one type of etched circuit board that may be utilized with the assembly of Fig. 5.
Figure 7:
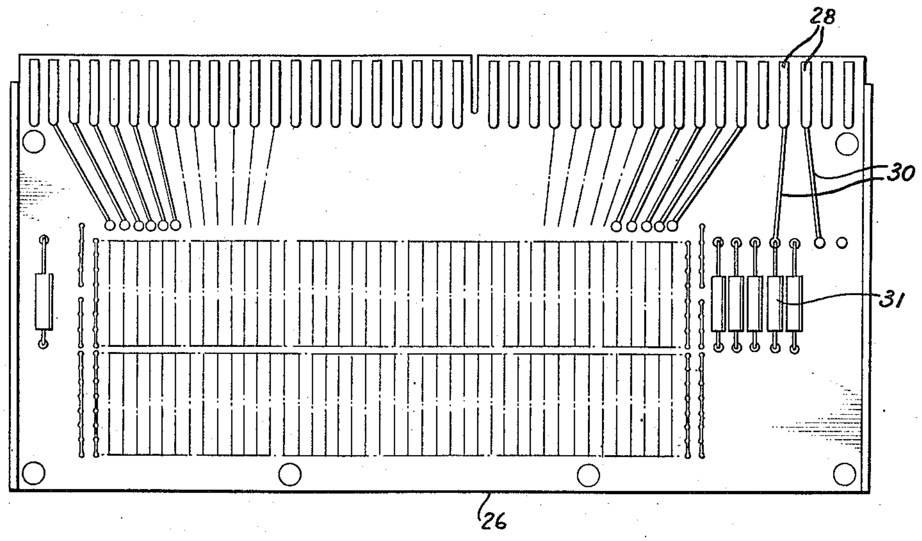
Fig. 7 is a top view of another type of etched circuit board that may be utilized with the assembly of Fig. 5.

Etched circuit boards 25 and 26, upon which the electronic components are mounted, are manually plugged into the connector strip assembly in the manner shown in Fig. 5, the boards being firmly supported in their positions by brackets 27 forming part of chassis 24. Examples of etched circuit boards 25 and 26 are shown in Figs. 6 and 7, respectively, and, as shown therein, each board comprises a plurality of etched terminal tabs 28 and a plurality of etched electrical conducting leads 30, the leads being used to electrically connect the terminal tabs to a plurality of electronic components. When boards 25 and 26 are plugged into the connector strip assembly, terminal tabs 28 make electrical contact with either contacts 15 or 16, depending upon the side of the assembly into which the boards are plugged. Thus, referring again to Fig. 5, terminal tabs 28 (Fig. 7) of etched boards 26 are in electrical contact with contacts 16 and terminal tabs 28 of etched boards 25 are in electrical contact with contacts 15, each terminal tab of a board being in contact with an associated one of the contacts.

It should be noted that for purposes of clarity and to expedite the description of the invention, only a few leads 30 and electrical components 31 are shown on boards 25 and 26. Furthermore, it will be apparent to those skilled in the art that in addition to terminal tabs 28 and leads 30 shown etched on one side of boards 25 and 26, similar terminal tabs and leads may also be etched on the reverse side of the boards, the electrical components being connected through the boards to the leads on the reverse side.

What is claimed is:

1. A connector strip for interconnecting electronic components mounted on etched circuit boards and for connecting said electrical components to external electrical circuits, said strip comprising: a dielectric base of substantially rectangular shape; a first set of spaced electrical conductors etched on one face of said base parallel to a long edge thereof; a second set of spaced electrical conductors etched on the opposite face of said base and intersecting said first plurality of conductors substantially at right angles, a selected one of said second set of conductors being electrically connected to a selected one of said first set of conductors at least at one predetermined intersecting point; a first plurality of spaced contacts mounted along one long edge of said base, one of said contacts being electrically connected to one of said first set of conductors and the remaining ones of said contacts being electrically connected to the second set of conductors; a shorting bus etched along the other long edge of said base; a second plurality of spaced contacts mounted along said other edge of said base and electrically connected to each other by said bus; and a plurality of parallel-spaced connector pins mounted along a short edge of said base and in the plane thereof, one of said pins being electrically connected to said bus and the other of said pins being electrically and individually connected to the remaining one of said first set of conductors.

2. An etched circuit assembly for interconnecting electronic components mounted on etched circuit boards and for connecting said electronic components to external electrical circuits, said assembly comprising: a chassis; a plurality of parellel-spaced dielectric strips, each of approximately rectangular shape, mounted on said chassis, each strip having a first set of parallel-spaced electrical conductors etched on one face thereof and a second set of parallel-spaced electrical conductors, intersecting said first set of conductors, etched on the opposite face thereof, selected ones of said first and second sets of conductors being electrically interconnected at least at one selected point of intersection; an array of connector pins arranged in rows and columns, one column of pins for each strip, each column of pins being mounted along one edge of an associated strip and electrically connected to the first set of conductors of said associated strip for connecting said first set of conductors to the external circuits; and at least one array of contacts arranged in rows and columns, one column of contacts for each strip, each column of contacts being mounted along another edge of an associated strip and electrically connected to the second conductors of said associated strip for connecting said second conductors to the electronic components.

References Cited in the file of this patent

UNITED STATES PATENTS

| | | |
|---|---|---|
| 1,334,276 | Adams | Mar. 23, 1920 |
| 2,558,008 | Smith | June 26, 1951 |
| 2,579,141 | Eckert et al. | Dec. 18, 1951 |
| 2,616,994 | Luhn | Nov. 4, 1952 |